United States Patent
We et al.

(10) Patent No.: US 9,633,950 B1
(45) Date of Patent: Apr. 25, 2017

(54) INTEGRATED DEVICE COMPRISING FLEXIBLE CONNECTOR BETWEEN INTEGRATED CIRCUIT (IC) PACKAGES

(71) Applicant: QUALCOMM Incorporated, San Diego, CA (US)

(72) Inventors: Hong Bok We, San Diego, CA (US); Jae Sik Lee, San Diego, CA (US); Dong Wook Kim, San Diego, CA (US)

(*) Notice: Subject to any disclaimer, the term of this patent is extended or adjusted under 35 U.S.C. 154(b) by 0 days.

(21) Appl. No.: 15/040,881

(22) Filed: Feb. 10, 2016

(51) Int. Cl.
*H01L 23/49* (2006.01)
*H01L 23/538* (2006.01)
*H01L 23/498* (2006.01)
*H01L 21/56* (2006.01)
*H01L 21/48* (2006.01)

(52) U.S. Cl.
CPC ...... *H01L 23/5387* (2013.01); *H01L 21/4853* (2013.01); *H01L 21/565* (2013.01); *H01L 23/49833* (2013.01)

(58) Field of Classification Search
CPC .............. H01L 23/5387; H01L 21/565; H01L 23/49833; H01L 21/4853
See application file for complete search history.

(56) References Cited

U.S. PATENT DOCUMENTS

| | | | |
|---|---|---|---|
| 6,448,508 B1 | 9/2002 | Lequenne | |
| 6,531,662 B1 | 3/2003 | Nakamura | |
| 6,940,729 B2 | 9/2005 | Cady et al. | |
| 7,061,122 B2 | 6/2006 | Kim et al. | |
| 7,606,041 B2 | 10/2009 | Park | |
| 7,902,676 B2* | 3/2011 | Chia | H01L 23/5387 257/686 |
| 8,031,475 B2* | 10/2011 | Chow | H01L 25/03 174/254 |
| 8,107,776 B2 | 1/2012 | Wang et al. | |
| 8,680,688 B2 | 3/2014 | Kang et al. | |
| 2006/0033217 A1* | 2/2006 | Taggart | H01L 23/5387 257/778 |
| 2014/0291006 A1 | 10/2014 | Yamamoto et al. | |
| 2015/0003108 A1 | 1/2015 | Park et al. | |

* cited by examiner

*Primary Examiner* — Roy Potter
*Assistant Examiner* — Paul Patton
(74) *Attorney, Agent, or Firm* — Loza & Loza, LLP

(57) ABSTRACT

Some features pertain to an integrated device that includes a first integrated circuit (IC) package, a flexible connector and a second integrated circuit (IC) package. The first integrated circuit (IC) package includes a first die, a plurality of first interconnects, and a first dielectric layer encapsulating the first die. The flexible connector is coupled to the first integrated circuit (IC) package. The flexible connector includes the first dielectric layer, and an interconnect. The second integrated circuit (IC) package is coupled to the flexible connector. The second integrated circuit (IC) package includes the first dielectric layer, and a plurality of second interconnects. The first integrated circuit (IC) package, the second integrated circuit (IC) package, and the flexible connector are coupled together through at least a portion (e.g., contiguous portion) of the first dielectric layer. In some implementations, the flexible connector comprises a dummy metal layer.

30 Claims, 14 Drawing Sheets

INTEGRATED DEVICE COMPRISING FLEXIBLE CONNECTOR BETWEEN INTEGRATED CIRCUIT (IC) PACKAGES

BACKGROUND

Field of the Disclosure

Various features may relate to an integrated device, and more specifically to an integrated device that includes a flexible connector between integrated circuit (IC) packages.

Background

Mobile devices, such as smart phones, tablets, Internet of Things (IoT), etc., require a multitude of components, chipsets, and the like. Typically, these components are provided on a printed circuit board with one or more integrated circuits. Packaging these components together into a product is becoming increasingly challenging, especially in devices that have odd shapes or curved shapes. To accommodate these odd shapes or curved shapes, flexible connectors are used to couple several printed circuit boards that include chips (e.g., dies), together.

FIG. 1 illustrates an integrated device 100 that includes a first integrated circuit (IC) package 102, a second integrated circuit (IC) package 104, and a flexible connector 106. The first integrated circuit (IC) package 102 includes a printed circuit board (PCB) 120 and a first chip 122 (e.g., die, die package). The second integrated circuit (IC) package 104 includes a printed circuit board (PCB) 140 and a second chip 142 (e.g., die, die package).

The first integrated circuit (IC) package 102 is coupled to the second integrated circuit (IC) package 104 through the flexible connector 106. The flexible connector 106 is a printed circuit board (PCB) connector. The flexible connector 106 includes a plurality of wires 160, a first PCB interface 162, a second PCB interface 164, and a cover 166. The cover 166 surrounds the plurality of wires 160. The plurality of wires 160 is coupled to the first PCB interface 162 and the second PCB interface 164. The first PCB interface 162 is coupled to a surface of the first PCB 120. The second PCB interface 164 is coupled to a surface of the second PCB 140.

As illustrated in FIG. 1, the integrated device 100 is comprised of three distinct components, the first integrated circuit (IC) package 102, the second integrated circuit (IC) package 104 and the flexible connector 106. These components are fabricated separately and then assembled to form the integrated device 100. The process of fabricating distinct components and then assembling them is an expensive process and creates a package that can be too large to put in small devices. It is desirable to reduce the size, height and/or spaces of packages, so that these packages are placed in smaller devices. Ideally, such a package will have a better form factor, be cheaper to fabricate, while at the same time meeting the needs of mobile devices, Internet of things (IoT) devices, and/or wearable devices.

SUMMARY

Various features may relate to an integrated device, and more specifically to an integrated device that includes a flexible connector between integrated circuit (IC) packages.

Some features pertain to an integrated device that includes a first integrated circuit (IC) package, a flexible connector and a second integrated circuit (IC) package. The first integrated circuit (IC) package includes a first die, a plurality of first interconnects, and a first dielectric layer encapsulating the first die. The flexible connector is coupled to the first integrated circuit (IC) package. The flexible connector includes the first dielectric layer, and an interconnect. The second integrated circuit (IC) package is coupled to the flexible connector. The second integrated circuit (IC) package includes the first dielectric layer, and a plurality of second interconnects. The first integrated circuit (IC) package, the second integrated circuit (IC) package, and the flexible connector are coupled together through at least a portion (e.g., contiguous portion) of the first dielectric layer.

Some features pertain to an integrated device that includes a first integrated circuit (IC) package, a means for electrical connecting and a second integrated circuit (IC) package. The first integrated circuit (IC) package includes a first die, a plurality of first interconnects, and a first dielectric layer encapsulating the first die. The means for electrical connecting is coupled to the first integrated circuit (IC) package. The second integrated circuit (IC) package is coupled to the flexible connector. The second integrated circuit (IC) package includes the first dielectric layer, and a plurality of second interconnects. The first integrated circuit (IC) package, the second integrated circuit (IC) package, and the means for electrical connecting are coupled together through at least a portion (e.g., contiguous portion) of the first dielectric layer.

Some features pertain to a method for fabricating an integrated device. The method provides a first integrated circuit (IC) package, where providing the first integrated circuit (IC) package includes providing a first die, forming a plurality of first interconnects, and forming a first dielectric layer that encapsulates the first die. The method forms a flexible connector such that the flexible connector is coupled to the first integrated circuit (IC) package, where forming the flexible connector includes forming the first dielectric layer, and forming an interconnect. The method provides a second integrated circuit (IC) package such that the second integrated circuit (IC) package is coupled to the flexible connector, where providing the second integrated circuit (IC) package includes forming the first dielectric layer, forming a plurality of second interconnects. The first integrated circuit (IC) package, the second integrated circuit (IC) package, and the flexible connector are formed such that the first integrated circuit (IC) package, the second integrated circuit (IC) package, and the flexible connector are coupled together through at least a portion of the first dielectric layer.

DRAWINGS

Various features, nature and advantages may become apparent from the detailed description set forth below when taken in conjunction with the drawings in which like reference characters identify correspondingly throughout.

DETAILED DESCRIPTION

Figure 1:
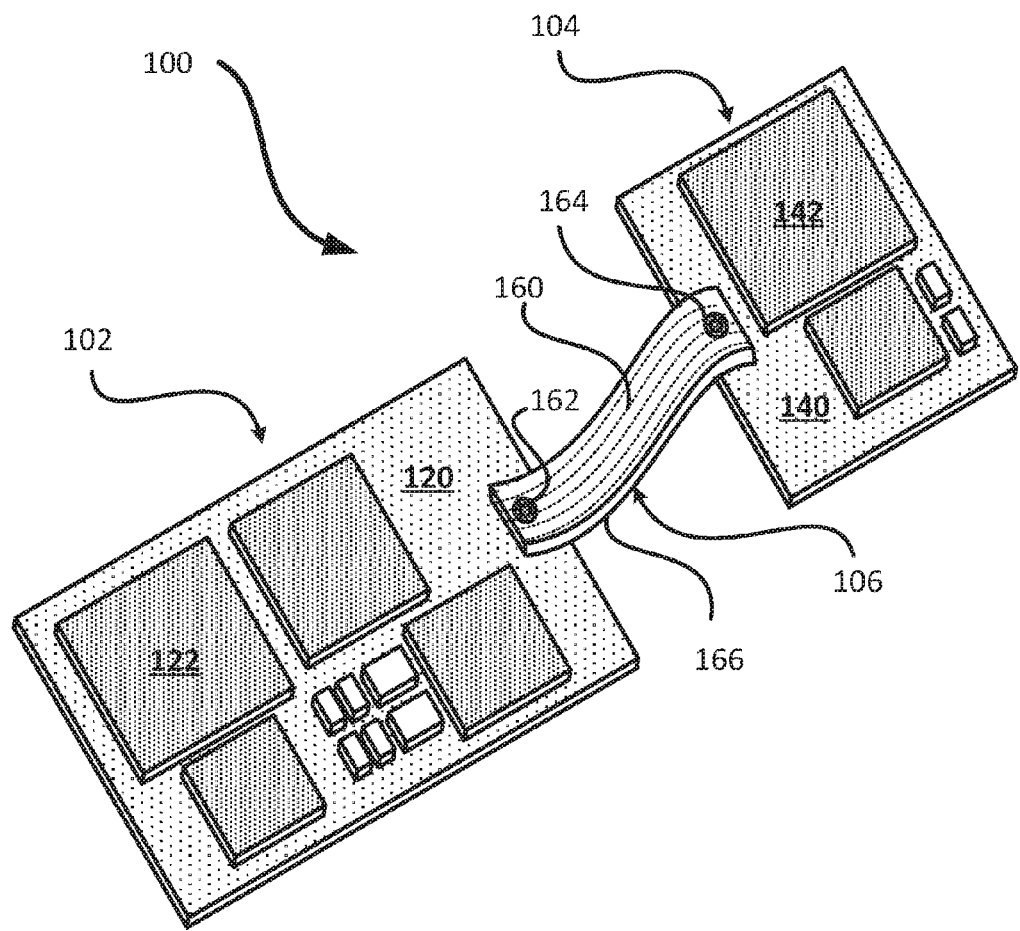
FIG. 1 illustrates a view of a device that includes two packages coupled together through a flexible connector.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to an integrated device that includes a first integrated circuit (IC) package, a flexible connector and a second integrated circuit (IC) package. The first integrated circuit (IC) package includes a first die, a plurality of first interconnects, and a first dielectric layer encapsulating the first die. The flexible connector is coupled to the first integrated circuit (IC) package. The flexible connector includes the first dielectric layer, and an interconnect. The second integrated circuit (IC) package is coupled to the flexible connector. The flexible connector may be a means for electrical connecting between two packages. The second integrated circuit (IC) package includes the first dielectric layer, and a plurality of second interconnects. The first integrated circuit (IC) package, the second integrated circuit (IC) package, and the flexible connector are coupled together through at least a portion of the first dielectric layer. In some implementations, the portion of the first dielectric layer that is shared by the first integrated circuit (IC) package, the second integrated circuit (IC) package, and the flexible connector share is a contiguous portion of the first dielectric layer. In some implementations, the flexible connector comprises a dummy metal layer. In some implementations, the first dielectric layer includes polyimide (PI) layer. In some implementations, the first dielectric layer includes a several dielectric layers. In some implementations, the first dielectric layer is configured to mechanically and structurally couple the first integrated circuit (IC) package and the second integrated circuit (IC) package. In some implementations, the interconnect of the flexible connector (e.g., means for electrical connecting) is configured to electrically couple the first integrated circuit (IC) package and the second integrated circuit (IC) package.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Integrated Device Comprising a Flexible Connector Between Packages

Figure 2:
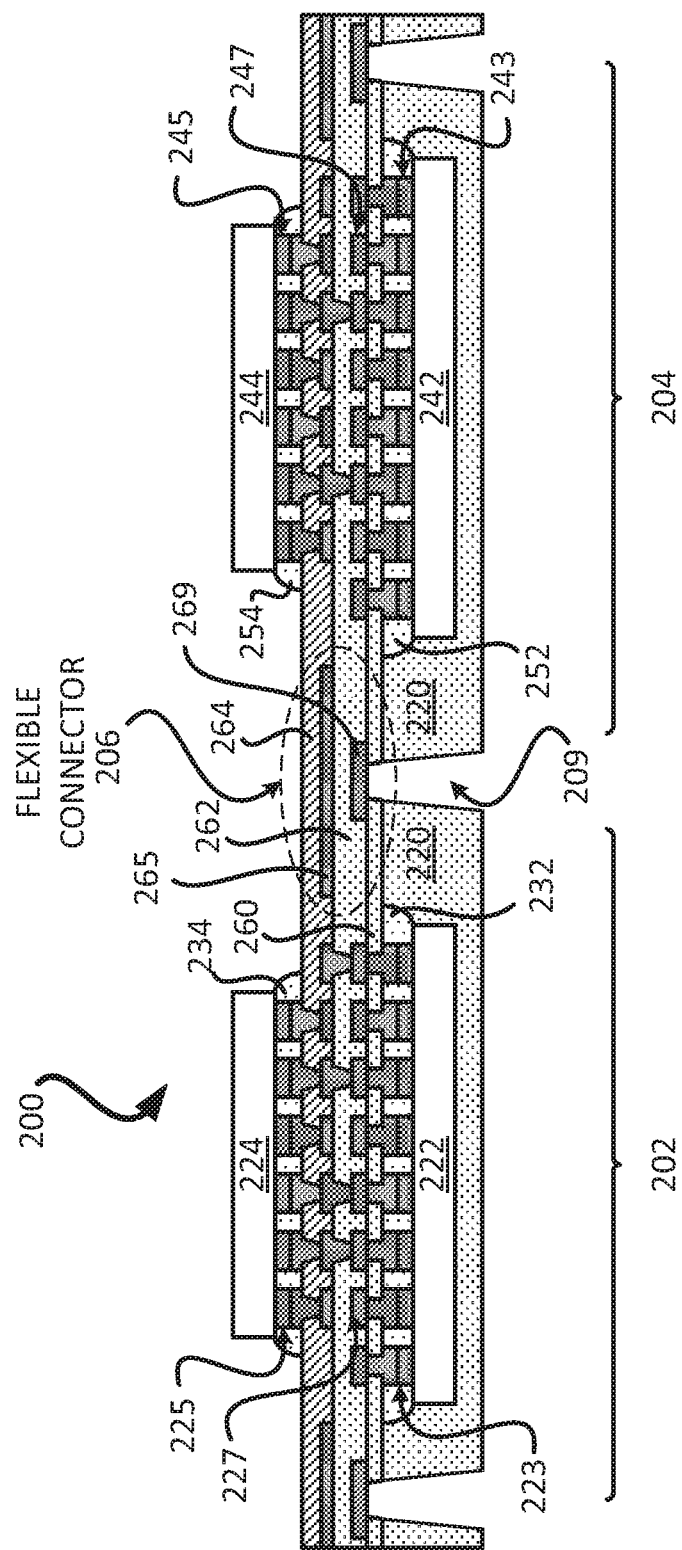
FIG. 2 illustrates a profile view of a device that includes two packages coupled together through a flexible connector.

FIG. 2 illustrates an integrated device 200 (e.g., integrated circuit (IC) device) that includes a first package 202 (e.g., first integrated circuit (IC) package), a second package 204 (e.g., second integrated circuit (IC) package) and a flexible connector 206 (e.g., means for electrical connecting between two packages). The first package 202 is coupled to the second package 204 through the flexible connector 206. As will be further described below, the flexible connector 206 is configured to electrically and/or mechanically couple the first package 202 to the second package 204.

In some implementations, the flexible connector 206 is embedded in the first package 202 and the second package 204. The flexible connector 206 includes at least dielectric layer that is shared with the first package 202 and the second package 204. Thus, the dielectric layer of the flexible connector 206 is also formed in the first package 202 and the second package 204.

As illustrated in FIG. 2, the first package 202 includes a first dielectric layer 220, a first die 222, a second die 224, a second dielectric layer 260, a third dielectric layer 262, a plurality of first interconnects 227, an underfill 232, an underfill 234, and a solder resist layer 264. In some implementations, the first dielectric layer 220, the second dielectric layer 260, and the third dielectric layer 262 are one dielectric layer. The first dielectric layer 220 encapsulates the first die 222. The first dielectric layer 220, the second dielectric layer 260, and the third dielectric layer 262 may include a polyimide (PI) layer.

In some implementations the first die 222 and/or the second die 224 is a die package (e.g., wafer level package). The first package 202 may be a package on package (PoP) device. The first die 222 includes a first active side (e.g., side comprising the plurality of first interconnects 223) and a first non-active side. The second die 224 includes a second active side (e.g., side comprising the plurality of first interconnects 225) and a second non-active side. As illustrated in FIG. 2, the first active side of the first die 222 faces the second active side of the second die 224.

The first die 222 is coupled to the plurality of first interconnects 227 through a plurality of interconnects 223. The plurality of first interconnects 227 include a trace, pad and/or via. The plurality of interconnects 223 include a pad and/or bump (e.g., copper pillar). In some implementations, one or more solder interconnects (e.g., solder ball) may be used to coupled the plurality of interconnects 223 to the plurality of first interconnects 227. The underfill 232 at least partially surround the plurality of interconnects 223. The plurality of first interconnects 227 may be formed in and/or on a dielectric layer (e.g., first dielectric layer 220, second dielectric layer 260, third dielectric layer 262). The solder resist layer 264 is formed over the third dielectric layer 262 and interconnects from the plurality of first interconnects 227.

FIG. 2 illustrates that the second die 224 is a surface mounted die. The second die 224 is coupled (e.g., mounted) to the solder resist layer 264. The second die 224 is coupled to the plurality of first interconnects 227 through a plurality of first interconnects 225. The plurality of first interconnects 225 include a pad and/or bump (e.g., copper pillar). In some implementations, one or more solder interconnects (e.g., solder ball) may be used to coupled the plurality of first interconnects 225 to the plurality of first interconnects 227. The underfill 234 at least partially surround the plurality of first interconnects 225.

As illustrated in FIG. 2, the second package 204 includes the first dielectric layer 220, a third die 242, a fourth die 244, the second dielectric layer 260, the third dielectric layer 262, a plurality of first interconnects 247, an underfill 252, an underfill 254, and the solder resist layer 264. In some implementations, the first dielectric layer 220, the second dielectric layer 260, and the third dielectric layer 262 are one dielectric layer. The first dielectric layer 220 encapsulates the third die 242. The first dielectric layer 220, the second dielectric layer 260, and the third dielectric layer 262 may include a polyimide (PI) layer.

In some implementations the third die 242 and/or the fourth die 244 is a die package (e.g., wafer level package). The second package 204 may be a package on package (PoP) device.

The third die 242 includes a first active side (e.g., side comprising the plurality of first interconnects 243) and a first non-active side. The fourth die 244 includes a second active side (e.g., side comprising the plurality of interconnects 245) and a second non-active side. As illustrated in FIG. 2, the first active side of the third die 242 faces the second active side of the fourth die 244.

The third die 242 is coupled to the plurality of first interconnects 247 through a plurality of interconnects 243. The plurality of first interconnects 247 include a trace, pad and/or via. The plurality of interconnects 243 include a pad and/or bump (e.g., copper pillar). In some implementations, one or more solder interconnects (e.g., solder ball) may be used to coupled the plurality of interconnects 243 to the plurality of first interconnects 247. The underfill 252 at least partially surround the plurality of interconnects 243. The plurality of first interconnects 247 may be formed in and/or on a dielectric layer (e.g., first dielectric layer 220, second dielectric layer 260, third dielectric layer 262). The solder resist layer 264 is formed over the third dielectric layer 262 and interconnects from the plurality of first interconnects 247.

FIG. 2 illustrates that the fourth die 244 is a surface mounted die. The fourth die 244 is coupled (e.g., mounted) to the solder resist layer 264. The fourth die 244 is coupled to the plurality of first interconnects 247 through a plurality of interconnects 245. The plurality of interconnects 245 include a pad and/or bump (e.g., copper pillar). In some implementations, one or more solder interconnects (e.g., solder ball) may be used to coupled the plurality of interconnects 245 to the plurality of first interconnects 247. The underfill 254 at least partially surround the plurality of interconnects 245.

The flexible connector 206 (e.g., means for electrical connecting between two packages) includes the second dielectric layer 260, the third dielectric layer 262 (in some implementations the third dielectric layer 262 is the first dielectric layer of the flexible connector 206), the solder resist layer 264, the interconnect 265, and a dummy metal layer 269. In some implementations, the flexible connector 206 is formed by forming and/or creating a cavity 209 in the first dielectric layer 220. A laser process may be used to form the cavity 209. The dummy metal layer 269 is used as a back stop to prevent the laser from further creating a cavity in the first dielectric layer 220, the second dielectric layer 260 and/or the third dielectric layer 262. In some implementations, a dummy metal layer (e.g., dummy metal layer 269) is configured to not transmit an electrical signal, or not be used as an electrical path for an electrical signal.

In some implementations, the second dielectric layer 260 and the third dielectric layer 262 are the same dielectric layer. In some implementations, the first dielectric layer 220, the second dielectric layer 260 and the third dielectric layer 262 are the same dielectric layer.

In some implementations, the first package 202, the second package 204, and the flexible connector 206 share the first dielectric layer 220, the second dielectric layer 260, the third dielectric layer 262, the solder resist layer 264, and the interconnect 265. In some implementations, the first dielectric layer 220, the second dielectric layer 260, the third dielectric layer 262, and/or the solder resist layer 264 are configured to provide mechanical and/or structural coupling between the first package 202, the flexible connector 206 and the second package 204. In some implementations, the interconnect 265 is configured to provide electrical coupling between the first package 202, the flexible connector 206, and the second package 204.

In some implementations, one or more portions of a dielectric layer (e.g., first dielectric layer 220, second dielectric layer 260, third dielectric layer 262) that is shared by the first integrated circuit (IC) package, the second integrated circuit (IC) package, and the flexible connector share (e.g., means for electrical connecting between two packages) is a contiguous portion of the dielectric layer.

The contiguous portion of the dielectric layer may traverse part (e.g., substantial part) or the entire first package 202 and/or the second package 204.

It is noted that FIG. 2 illustrates the flexible connector 206 with one layer of the interconnect 265. The interconnect 265 may include a plurality of interconnects. In some implementations, the flexible connector 206 may include several layers of the interconnect 265 formed on different metal layers. Similarly, the flexible connector 206 may include several different layers of the dielectric layers.

The above features and implementations of a flexible connector provide several technical advantages over other connections between packages. These technical advantages are further described below.

One, sharing the dielectric layers (e.g., polyimide (PI) layer), and/or interconnects with the first package 202, the flexible connector 206 and the second package 204 provides a more compact form factor for a connection or a coupling between the first package 202 and the second package 204. Since the first package 202, the flexible connector 206, and the second package 204 share materials, there is no need to add extra interfaces to mechanically couple the first package 202, the flexible connector 206 and the second package 204. In contrast to FIG. 1, which illustrates three (3) separate components (a first integrated circuit (IC) package 102, a second integrated circuit (IC) package 104, and a flexible connector 106) that are fabricated separately and mechanically assembled together, in some implementations, the first package 202, the flexible connector 206 and the second package 204 may be considered as one contiguous body (e.g., unibody package that includes the first package 202, the flexible connector 206 and the second package 204).

Two, sharing the dielectric layers (e.g., polyimide (PI) layer) and/or interconnects with the first package 202, the flexible connector 206 and the second package 204 means that the first package 202, the flexible connector 206 and the second package 204 may be fabricated together, which lowers the overall fabrication cost of the first package 202, the flexible connector 206 and the second package 204.

Three, the implementation or embedding of the flexible connector 206 with the first package 202 and the second package 204 means a more accurate and precise connection between the first package 202 and the second package 204, since the interconnects of the flexible connector 206, the first package 202 and the second package 204 are formed during the same fabrication process. In some implementations, using the same fabrication process to fabricate the flexible connector 206, the first package 202 and the second package 204 240 means there is less likelihood of misalignment between connections. Generally speaking mechanical assembly of components, which is used to assemble the integrated device 100 of FIG. 1, is more prone to misalignment.

Four, the interconnects (e.g., interconnect 265) of the flexible connector 206 have finer pitch and finer spacing than other connectors and thus provide higher density connections between the first package 202 and the second package 204. In some implementations, this is possible because the interconnects (e.g., interconnect 265) of the flexible connector 206 are formed using the same fabrication process as the interconnects of the first package 202 and the interconnects of the second package 204.

Five, the integrated device 200 provides a fully functional integrated device without the need of a printed circuit board (PCB) and/or motherboard. In some implementations, the above exemplary integrated device 200 is configured to allow the first package 202 to be electrically coupled to the second package 204 without the need of a printed circuit board (PCB). That is, for example, one or more electrical signals (e.g., input/output signals) may traverse between the first package 202 and the second package 204 without traversing through a printed circuit board (PCB). Thus, in some implementations, electrical signals may traverse between a first package and a second package and bypass a printed circuit board (PCB), even if a printed circuit board (PCB) is present and/or mechanically coupled to integrated device.

In some implementations, the above technical advantages may apply to the other integrated devices (e.g., 300, 400, 500, 600) described in the present disclosure.

Exemplary Integrated Device Comprising a Flexible Connector Between Packages

Figure 3:
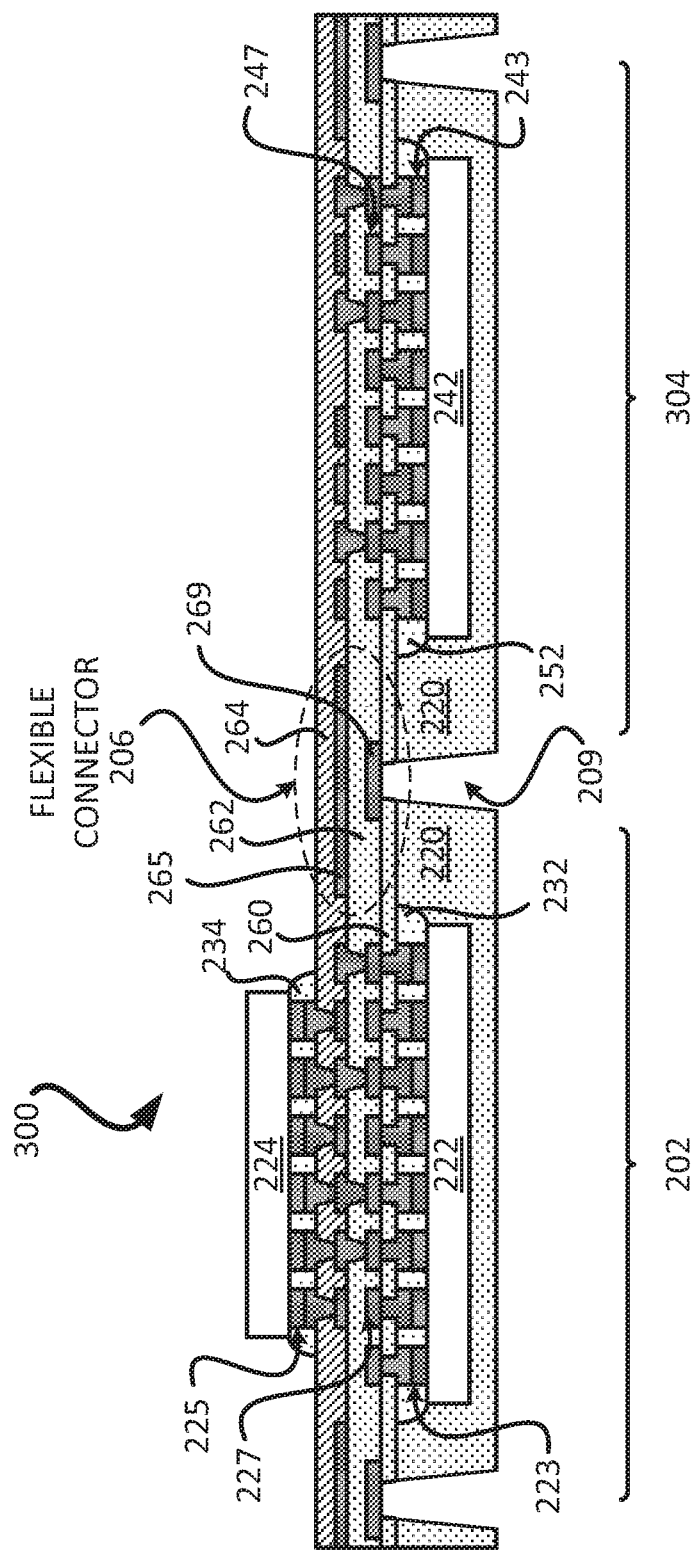
FIG. 3 illustrates a profile view of a device that includes two packages coupled together through a flexible connector.

FIG. 3 illustrates an integrated device 300 (e.g., integrated circuit (IC) device) that includes the first package 202 (e.g., first integrated circuit (IC) package), a second package 304 (e.g., second integrated circuit (IC) package) and the flexible connector 206 (e.g., means for electrical connecting between two packages). The first package 202 is coupled to the second package 304 through the flexible connector 206. The flexible connector 206 is configured to electrically couple the first package 202 to the second package 304.

FIG. 3 is similar to FIG. 2, except the second package 304 is different than the second package 204 of FIG. 2. In particular, the second package 304 of FIG. 3 does not include the fourth die 244.

As illustrated in FIG. 3, the second package 304 includes the first dielectric layer 220, the third die 242, the second dielectric layer 260, the third dielectric layer 262, the plurality of first interconnects 247, the underfill 252 and the solder resist layer 264. In some implementations, the first dielectric layer 220, the second dielectric layer 260, and the third dielectric layer 262 are one dielectric layer. The first dielectric layer 220 encapsulates the third die 242. The first dielectric layer 220, the second dielectric layer 260, and the third dielectric layer 262 may include a polyimide (PI) layer. In some implementations the third die 242 is a die package (e.g., wafer level package).

In some implementations, the first package 202, the second package 304, and the flexible connector 206 share the first dielectric layer 220, the second dielectric layer 260, the third dielectric layer 262, the solder resist layer 264, and the interconnect 265. In some implementations, the first dielectric layer 220, the second dielectric layer 260, the third dielectric layer 262, and/or the solder resist layer 264 are configured to provide mechanical and/or structural coupling between the first package 202, the flexible connector 206 and the second package 304. In some implementations, the interconnect 265 is configured to provide electrical coupling between the first package 202, the flexible connector 206, and the second package 304.

In some implementations, one or more portions of a dielectric layer (e.g., first dielectric layer 220, second dielectric layer 260, third dielectric layer 262) that is shared by the first integrated circuit (IC) package, the second integrated circuit (IC) package, and the flexible connector share is a contiguous portion of the dielectric layer. The contiguous portion of the dielectric layer may traverse part (e.g., substantial part) or the entire first package 202 and/or the second package 304.

Exemplary Integrated Device Comprising a Flexible Connector Between Packages

Figure 4:
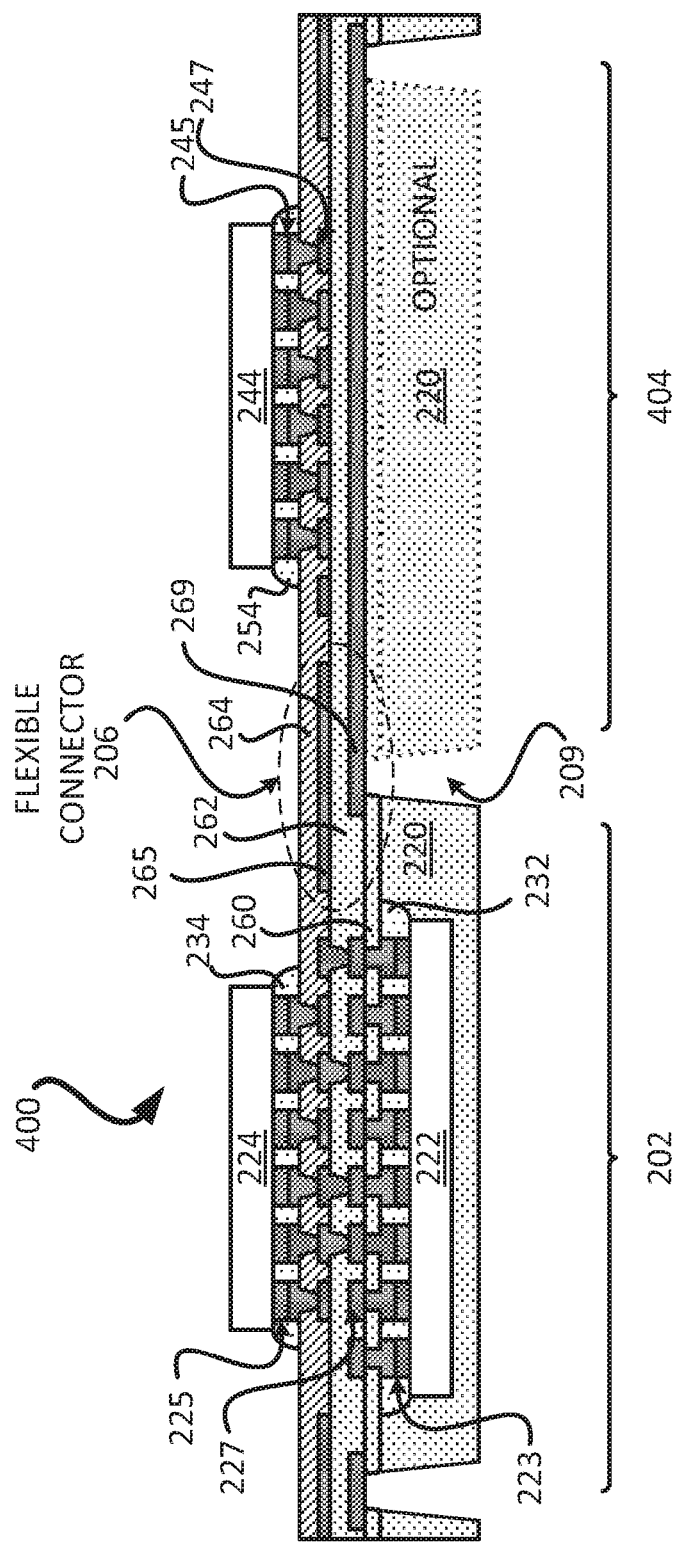
FIG. 4 illustrates a profile view of a device that includes two packages coupled together through a flexible connector.

FIG. 4 illustrates an integrated device 400 (e.g., integrated circuit (IC) device) that includes the first package 202 (e.g., first integrated circuit (IC) package), a second package 404 (e.g., second integrated circuit (IC) package) and the flexible connector 206. The first package 202 is coupled to the second package 404 through the flexible connector 206 (e.g., means for electrical connecting between two packages). The flexible connector 206 is configured to electrically couple the first package 202 to the second package 404.

FIG. 4 is similar to FIG. 2, except the second package 404 is different than the second package 204 of FIG. 2. In particular, the second package 404 of FIG. 4 does not include the fourth die 244.

As illustrated in FIG. 4, the second package 404 includes the first dielectric layer 220, the fourth die 244, the second dielectric layer 260, the third dielectric layer 262, the plurality of first interconnects 247, the underfill 254 and the solder resist layer 264. In some implementations, the first dielectric layer 220, the second dielectric layer 260, and the third dielectric layer 262 are one dielectric layer. The first dielectric layer 220, the second dielectric layer 260, and the third dielectric layer 262 may include a polyimide (PI) layer. In some implementations the fourth die 244 is a die package (e.g., wafer level package).

The fourth die 244 is a surface mounted die. The fourth die 244 is coupled (e.g., mounted) to the solder resist layer 264. The fourth die 244 is coupled to the plurality of first interconnects 247 through a plurality of interconnects 245. The plurality of interconnects 245 include a pad and/or bump (e.g., copper pillar). In some implementations, one or more solder interconnects (e.g., solder ball) may be used to coupled the plurality of interconnects 245 to the plurality of first interconnects 247. The underfill 254 at least partially surround the plurality of interconnects 245.

In some implementations, the first package 202, the second package 404, and the flexible connector 206 share the first dielectric layer 220, the second dielectric layer 260, the third dielectric layer 262, the solder resist layer 264, and the interconnect 265. In some implementations, the first dielectric layer 220, the second dielectric layer 260, the third dielectric layer 262, and/or the solder resist layer 264 are configured to provide mechanical and/or structural coupling between the first package 202, the flexible connector 206 and the second package 404. In some implementations, the interconnect 265 is configured to provide electrical coupling between the first package 202, the flexible connector 206, and the second package 404.

In some implementations, one or more portions of a dielectric layer (e.g., first dielectric layer 220, second dielectric layer 260, third dielectric layer 262) that is shared by the first integrated circuit (IC) package, the second integrated circuit (IC) package, and the flexible connector share is a contiguous portion of the dielectric layer. The contiguous portion of the dielectric layer may traverse part (e.g., substantial part) or the entire first package 202 and/or the second package 404.

It is noted that in some implementations, the first dielectric layer 220 and/or the second dielectric layer 260 in the second package 404 may be optional (as indicated by the dashed outline).

Exemplary Integrated Device Comprising a Flexible Connector Between Packages

Figure 5:
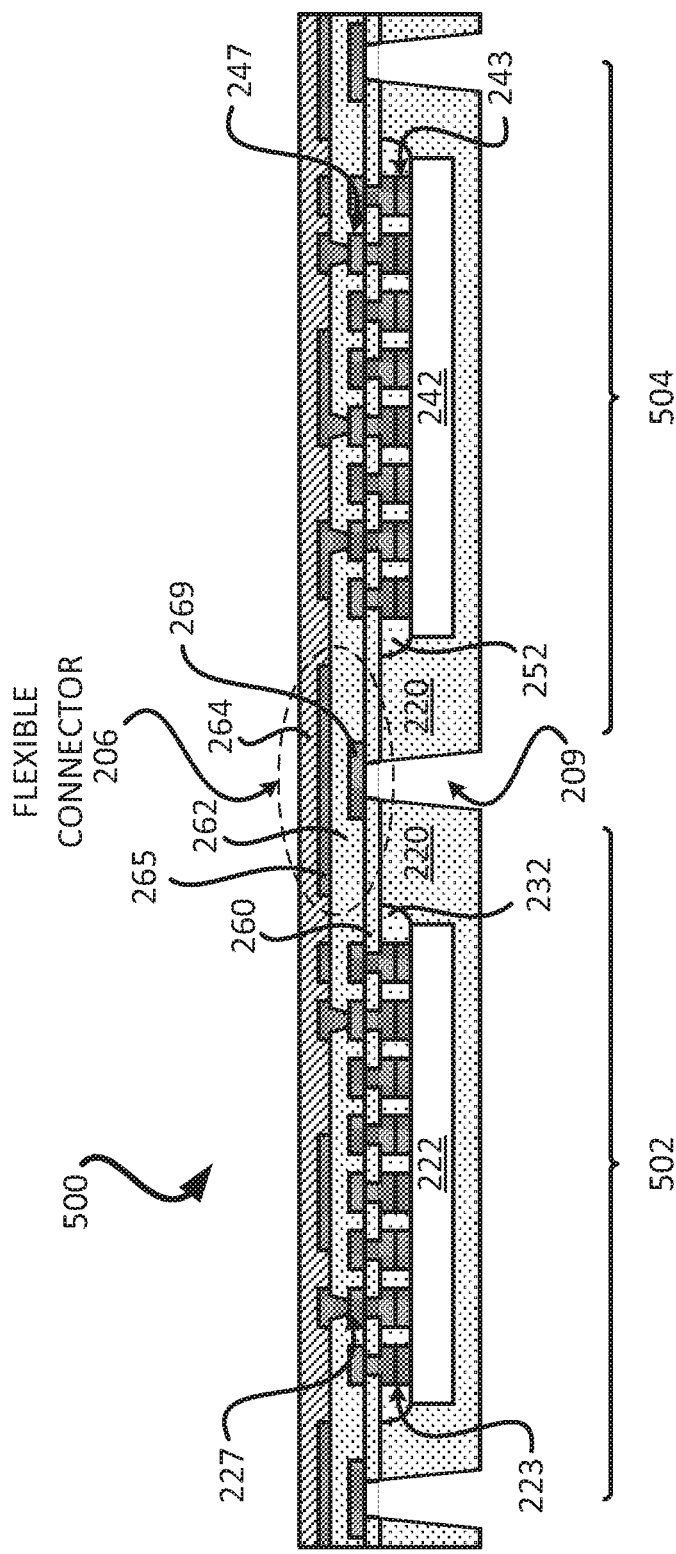
FIG. 5 illustrates a profile view of a device that includes two packages coupled together through a flexible connector.

FIG. 5 illustrates an integrated device 500 (e.g., integrated circuit (IC) device) that includes the first package 502 (e.g., first integrated circuit (IC) package), a second package 504 (e.g., second integrated circuit (IC) package) and the flexible connector 206. The first package 202 is coupled to the second package 504 through the flexible connector 206 (e.g., means for electrical connecting between two packages). The flexible connector 206 is configured to electrically couple the first package 502 to the second package 504.

FIG. 5 is similar to FIG. 2, except (i) the first package 502 is different than the first package 202, and (ii) the second package 504 is different than the second package 204 of FIG. 2. In particular, the first package 502 and the second package 504 of FIG. 5 do not include a surface mounted die.

In some implementations, the first package 502, the second package 504, and the flexible connector 206 share the first dielectric layer 220, the second dielectric layer 260, the third dielectric layer 262, the solder resist layer 264, and the interconnect 265. In some implementations, the first dielectric layer 220, the second dielectric layer 260, the third dielectric layer 262, and/or the solder resist layer 264 are configured to provide mechanical and/or structural coupling between the first package 502, the flexible connector 206 and the second package 504. In some implementations, the interconnect 265 is configured to provide electrical coupling between the first package 502, the flexible connector 206, and the second package 504.

In some implementations, one or more portions of a dielectric layer (e.g., first dielectric layer 220, second dielectric layer 260, third dielectric layer 262) that is shared by the first integrated circuit (IC) package, the second integrated circuit (IC) package, and the flexible connector share is a contiguous portion of the dielectric layer. The contiguous portion of the dielectric layer may traverse part (e.g., substantial part) or the entire first package 502 and/or the second package 504.

Figure 6:
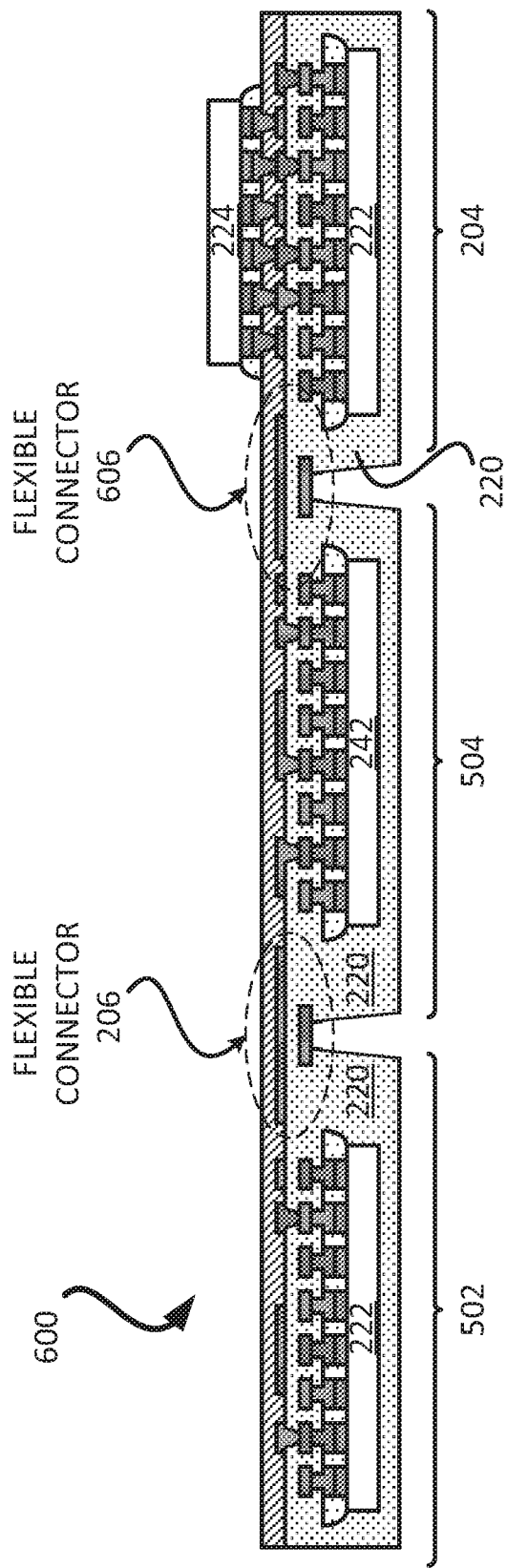
FIG. 6 illustrates a profile view of a device that includes two packages coupled together through a flexible connector.

FIGS. 2-5 illustrate integrated devices that include two packages. However, in some implementations, an integrated device may include more than two packages. FIG. 6 illustrates an integrated device 600 that includes three packages; the first package 502, the second package 504, and the second package 204. The second package 204 may be a package on package (PoP) device.

The first package 502 is coupled (e.g., electrically coupled and/or mechanically coupled) to the second package 504 through the flexible connector 206. The second package 504 is coupled (e.g., electrically coupled and/or mechanically coupled) to the second package 204 through the flexible connector 606. The flexible connector 606 (e.g., means for electrical connecting between two packages) may be similar to the flexible connector 206. It is noted that the integrated device 600 may be formed by any of the packages described in the present disclosure.

Exemplary Sequence for Fabricating an Integrated Device Comprising a Flexible Connector Between Packages In some implementations, providing/fabricating an integrated circuit (IC) device that includes an embedded flexible connector includes several processes. FIG. 7 (which includes FIGS. 7A-7F) illustrates an exemplary sequence for providing/fabricating integrated circuit (IC) device that includes an embedded flexible connector. In some implementations, the sequence of FIGS. 7A-7F may be used to fabricate the integrated circuit (IC) device that includes an embedded flexible connector of FIG. 2 and/or other integrated circuit (IC) devices described in the present disclosure. FIG. 7A-7F will now be described in the context of providing/fabricating the integrated circuit (IC) device of FIG. 2.

It should be noted that the sequence of FIGS. 7A-7F may combine one or more stages in order to simplify and/or clarify the sequence for providing integrated circuit (IC) device that includes an embedded flexible connector. In some implementations, the order of the processes may be changed or modified.

Figure 7A:
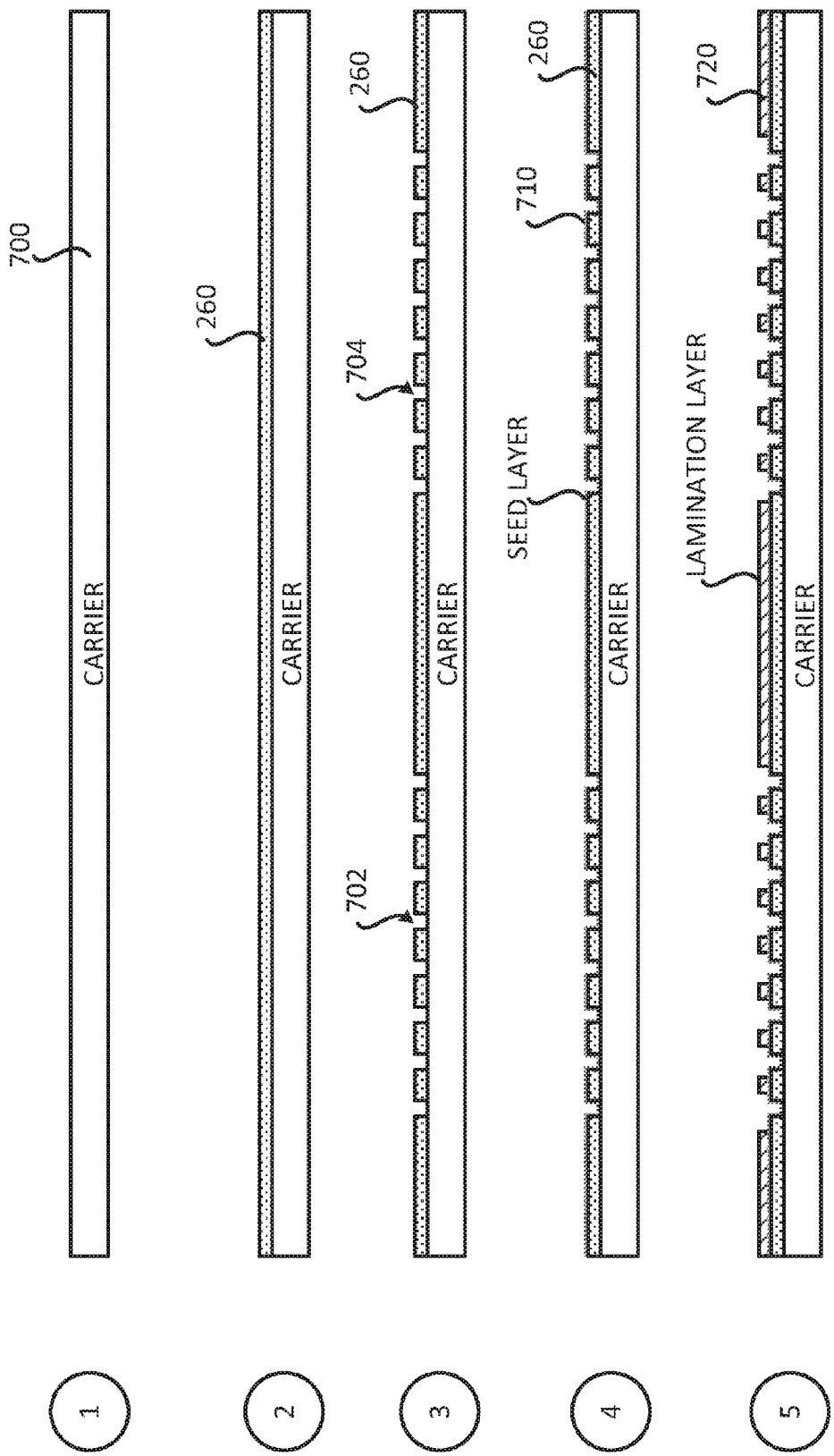
FIG. 7 (which comprises FIGS. 7A-7F) illustrates an example of a sequence for fabricating a device that includes two packages coupled together through a flexible connector.

Stage 1 of FIG. 7A, illustrates a carrier 700 that is provided. The carrier 700 may be provided by a supplier or fabricated. The carrier 700 may be an adhesive layer.

Stage 2 illustrates a second dielectric layer 260 formed on the carrier 700. The second dielectric layer 260 may include a polyimide (PI) layer. In some implementations, the second dielectric layer 260 is formed by providing a liquid dielectric on the carrier 700 and then cured.

Stage 3 illustrates a cavity 702 and a cavity 704 formed in the second dielectric layer 260. Different implementations may form the cavities (e.g., cavity 702, cavity 704) differently. In some implementations, the cavity is formed using a laser process and/or a photo-etching process (e.g., when the second dielectric layer 260 is photoetchable).

Stage 4 illustrates a seed layer 710 formed over the second dielectric layer 260 and the carrier 700. In some implementations, the seed layer 710 may follow the shape and/or the contour of the second dielectric layer 260. The seed layer 710 may include a metal layer (e.g., copper layer).

Stage 5 illustrates a lamination layer 720 formed over the seed layer 710. The lamination layer 720 may be a photo resist (PR) layer.

Figure 7B:
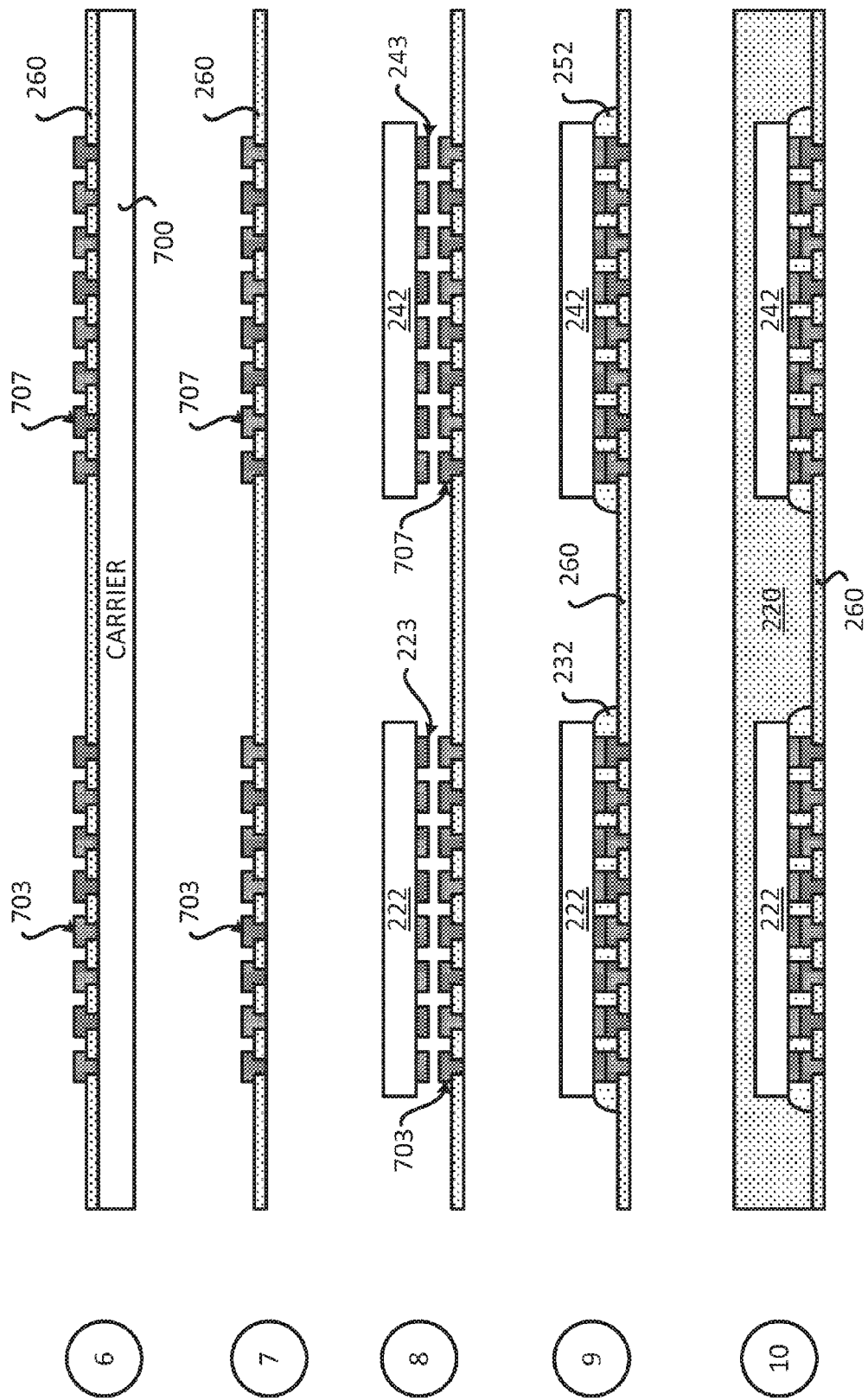

Stage 6 of FIG. 7B, illustrates a plurality of interconnects 703 and a plurality of interconnects 707 formed in and/or on the second dielectric layer 260. In some implementations, the plurality of interconnects 703 and the plurality of interconnects 707 are formed in openings of the lamination layer 720. Stage 6 illustrates the lamination layer 720 removed after the plurality of interconnects 703 and the plurality of interconnects 707 have been formed.

Stage 7 illustrates the carrier 700 being decoupled (e.g., detached, removed) from the second dielectric layer 260, the plurality of interconnects 703 and the plurality of interconnects 707.

Stage 8 illustrates the first die 222 coupled to the plurality of interconnects 703 through the plurality of first interconnects 223. Stage 8 also illustrates the third die 242 coupled to the plurality of interconnects 707 through the plurality of first interconnects 243. In some implementations, solder interconnects (e.g., solder ball), which are not shown, may be used to couple the plurality of interconnects 703 to the plurality of first interconnects 223. Similarly, in some implementations, solder interconnects (e.g., solder ball), which are not shown, may be used to couple the plurality of interconnects 707 to the plurality of first interconnects 243.

Stage 9 illustrates the underfill 232 formed between the first die 222 and the second dielectric layer 260. The underfill 232 at least partially surrounds the plurality of interconnects 703 and the plurality of first interconnects 223. Stage 9 also illustrates the underfill 252 formed between the third die 242 and the second dielectric layer 260. The underfill 252 at least partially surrounds the plurality of interconnects 707 and the plurality of first interconnects 243. It is noted that the underill is optional.

Stage 10 illustrates a first dielectric layer 220 formed over the first die 222, the third die 242, and the second dielectric layer 260. The first dielectric layer 220 may at least partially encapsulate the first die 222 and the third die 242. The first dielectric layer 220 may include a polyimide (PI) layer. The first dielectric layer 220 may be the same as the second dielectric layer 260 (e.g., both may be one dielectric layer).

Figure 7C:
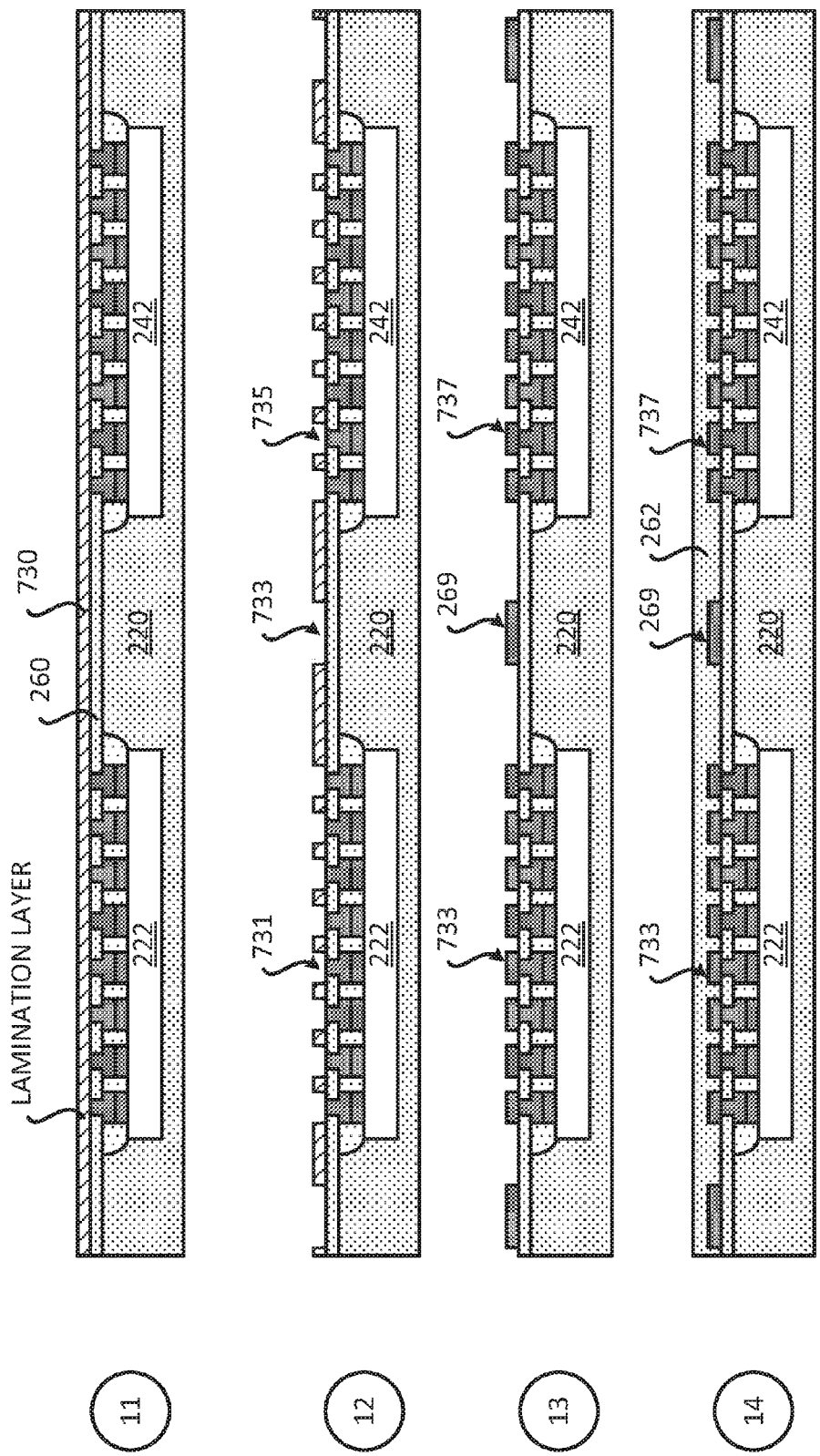

Stage 11 of FIG. 7C, illustrates a lamination layer 730 formed over the second dielectric layer 260. The lamination layer 720 may be a photo resist (PR) layer.

Stage 12 illustrates a plurality of cavities 731 and a plurality of cavities 735 formed in the lamination layer 730. Different implementations may form the cavities differently. In some implementations, the cavity is formed using a laser process and/or a photo-etching process.

Stage 13 illustrates a plurality of interconnects 733 and a plurality of interconnects 737 formed on the second dielectric layer 260. Stage 13 also illustrates the dummy metal layer 269 formed over the second dielectric layer 260. In some implementations, the plurality of interconnects 733, the plurality of interconnects 737 and the dummy metal layer 269 are formed in cavities/openings of the lamination layer 730. Stage 13 illustrates the lamination layer 730 removed after the plurality of interconnects 733, the plurality of interconnects 737 and the dummy metal layer 269 have been formed.

Stage 14 illustrates a third dielectric layer 262 formed over the second dielectric layer 260. In some implementations, the third dielectric layer 262 includes a polyimide (PI) layer. In some implementations, the third dielectric layer 262, the second dielectric layer 260 and the first dielectric layer 220 is one dielectric layer.

Figure 7D:
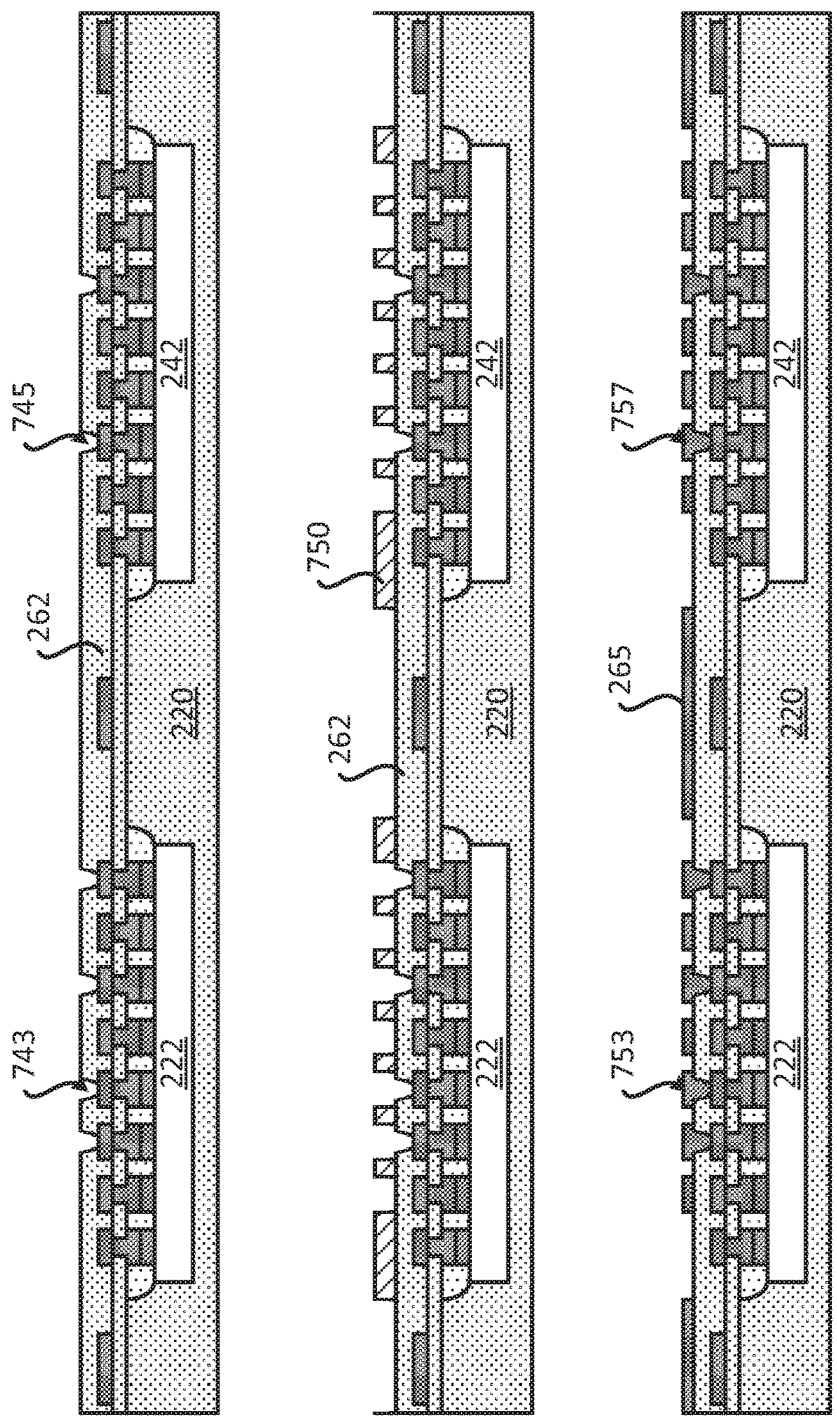

Stage 15 of FIG. 7D illustrates a plurality of cavities 743 and a plurality of cavities 745 formed in the third dielectric layer 262. Different implementations may form the cavities differently. In some implementations, the cavity is formed using a laser process and/or a photo-etching process.

Stage 16 illustrates a lamination layer 750 formed over the seed layer 710. The lamination layer 750 may be a photo resist (PR) layer. The lamination layer 750 may include cavities and/or openings. Different implementations may form the cavities differently. In some implementations, the cavity is formed using a laser process and/or a photo-etching process.

Stage 17 illustrates a plurality of interconnects 753 and a plurality of interconnects 757 formed in and/or on the third dielectric layer 262. Stage 17 also illustrates the interconnect 265 formed over the third dielectric layer 262. In some implementations, the plurality of interconnects 753, the plurality of interconnects 757 and the interconnect 265 are formed in cavities/openings of the lamination layer 750. Stage 17 illustrates the lamination layer 750 removed after the plurality of interconnects 753, the plurality of interconnects 757 and the interconnect 265 have been formed.

Figure 7E:
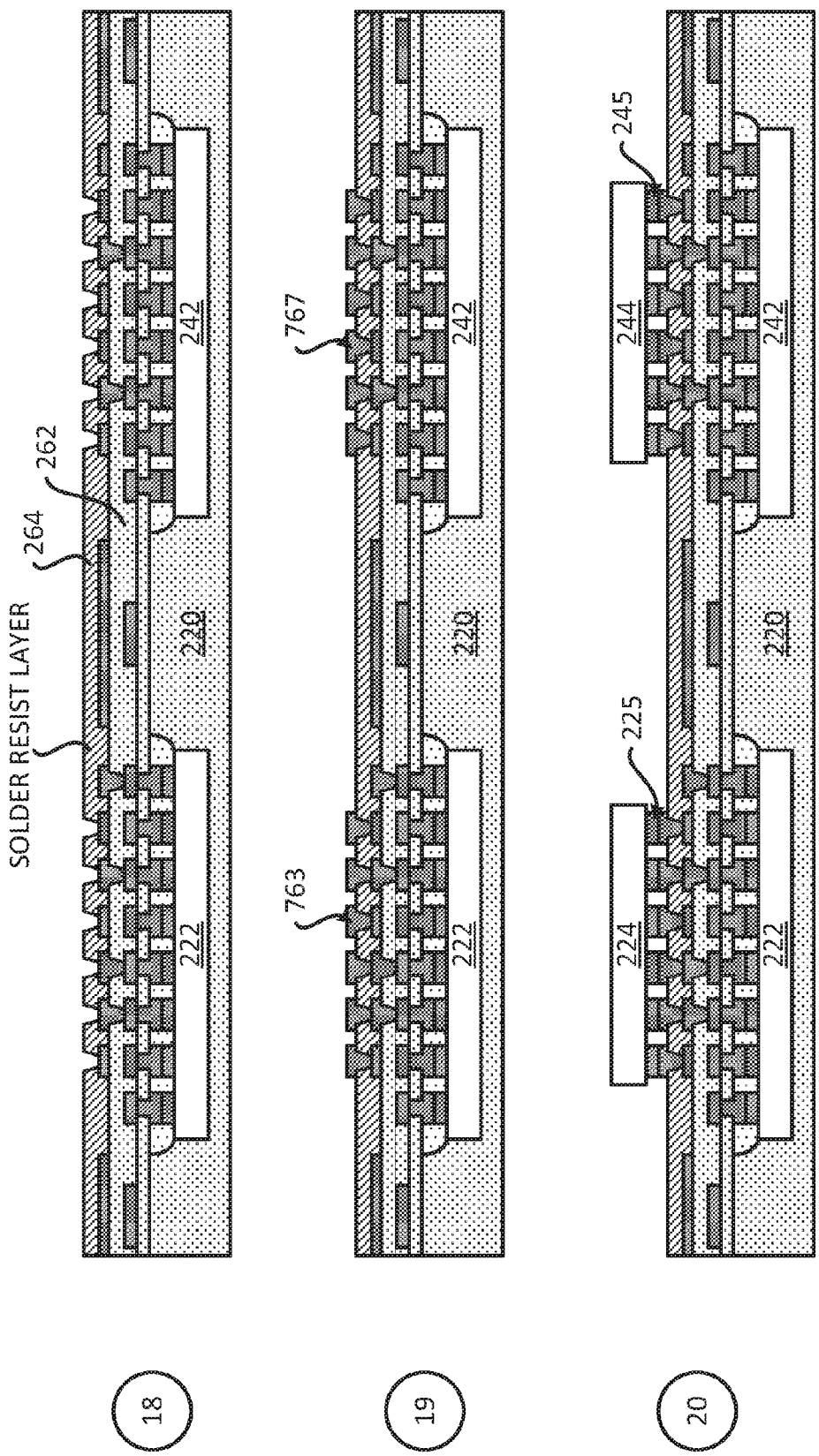

Stage 18 of FIG. 7E, illustrates the solder resist layer 264 formed over the third dielectric layer 262 and the interconnect 265.

Stage 19 illustrates a plurality of interconnects 763 and a plurality of interconnects 767 formed in and/or on the solder resist layer 264. In some implementations, the plurality of interconnects 703, 733, 753 and/or 763 may be the plurality of first interconnects 227. Similarly, in some implementations, the plurality of interconnects 707, 737, 757 and/or 767 may be the plurality of first interconnects 247.

Stage 20 illustrates the second die 224 coupled to the plurality of interconnects 763 through the plurality of first interconnects 225. Stage 20 also illustrates the fourth die 244 coupled to the plurality of interconnects 767 through the plurality of interconnects 245. In some implementations, solder interconnects (e.g., solder balls) may be used to coupled the plurality of first interconnects 225 to the plurality of interconnects 763. In some implementations, solder interconnects (e.g., solder balls) may be used to coupled the plurality of interconnects 245 to the plurality of interconnects 767.

Figure 7F:
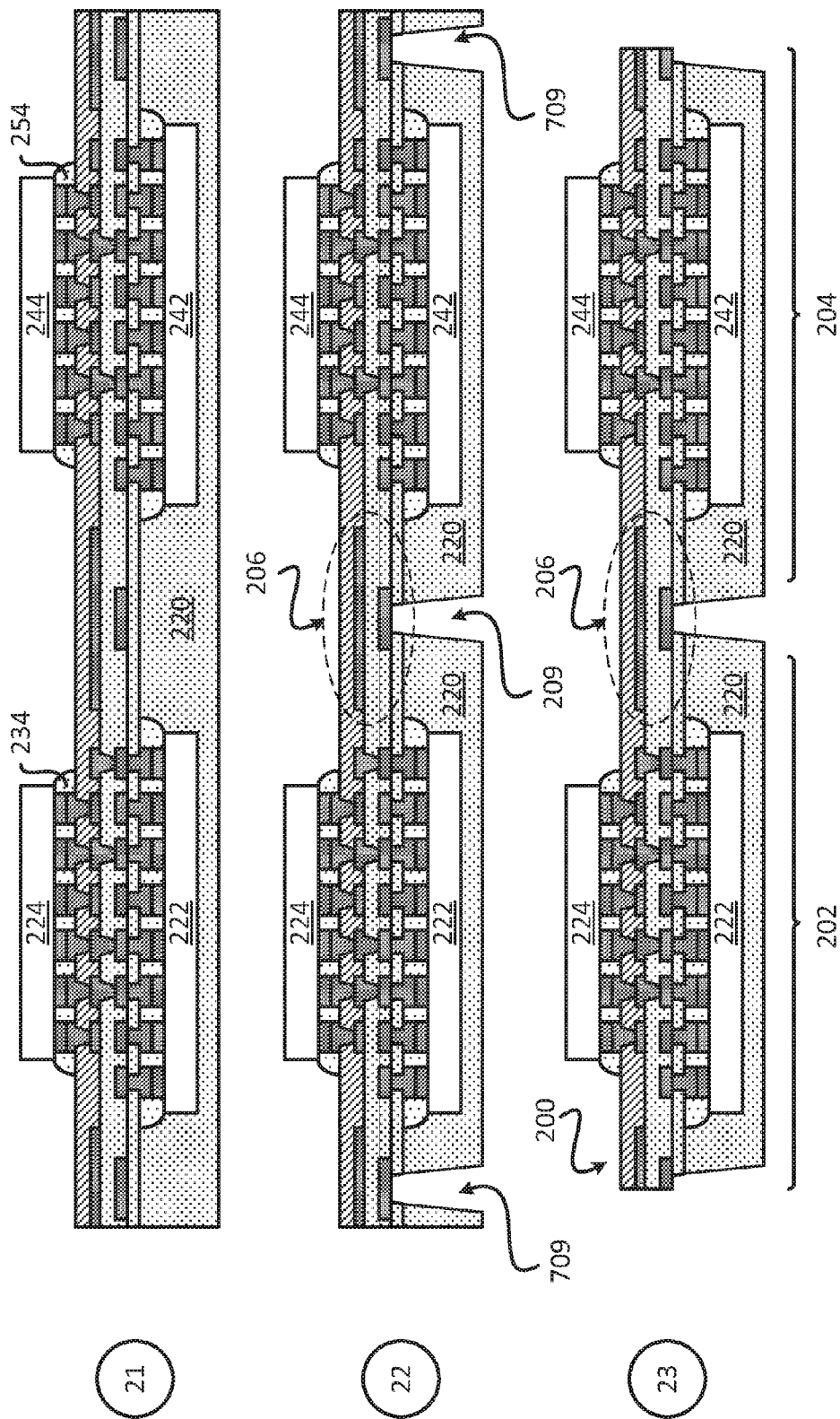

Stage 21 of FIG. 7F, illustrates the underfill 234 formed between the second die 224 and the solder resist layer 264. Stage 21 also illustrates the underfill 254 formed between the fourth die 244 and the solder resist layer 264.

Stage 22 illustrates the cavity 209 and the cavity 709 formed in at least the first dielectric layer 220. In some implementations, a laser process is used to form the cavity 209 and the cavity 709. In some implementations, the cavity 209 is formed in the first dielectric layer 220 up to the dummy metal layer 269, which acts as a back stop to prevent from the laser from further drilling the dielectric layers. In some implementations, forming the cavity 209 creates the flexible connector 206 (e.g., means for electrical connecting between two packages) that allows a flexible and/or bendable connection between a first package and a second package. In some implementations, the flexible connector 206 includes the first dielectric layer 220, the second dielectric layer 260, the third dielectric layer 262, the solder resist layer 264, the interconnect 265 and the dummy metal layer 269.

Stage 23 illustrates the first package 202 coupled to the second package 204 through the flexible connector 206, as described in FIG. 2. Stage 23 illustrates the cutting and/or slicing of the third dielectric layer 262 and the solder resist layer 264 to dice the packages. In some implementations, a laser process and/or a mechanical process (e.g., saw) may be used to further cut the third dielectric layer 262 and the solder resist layer 264.

Figure 8:
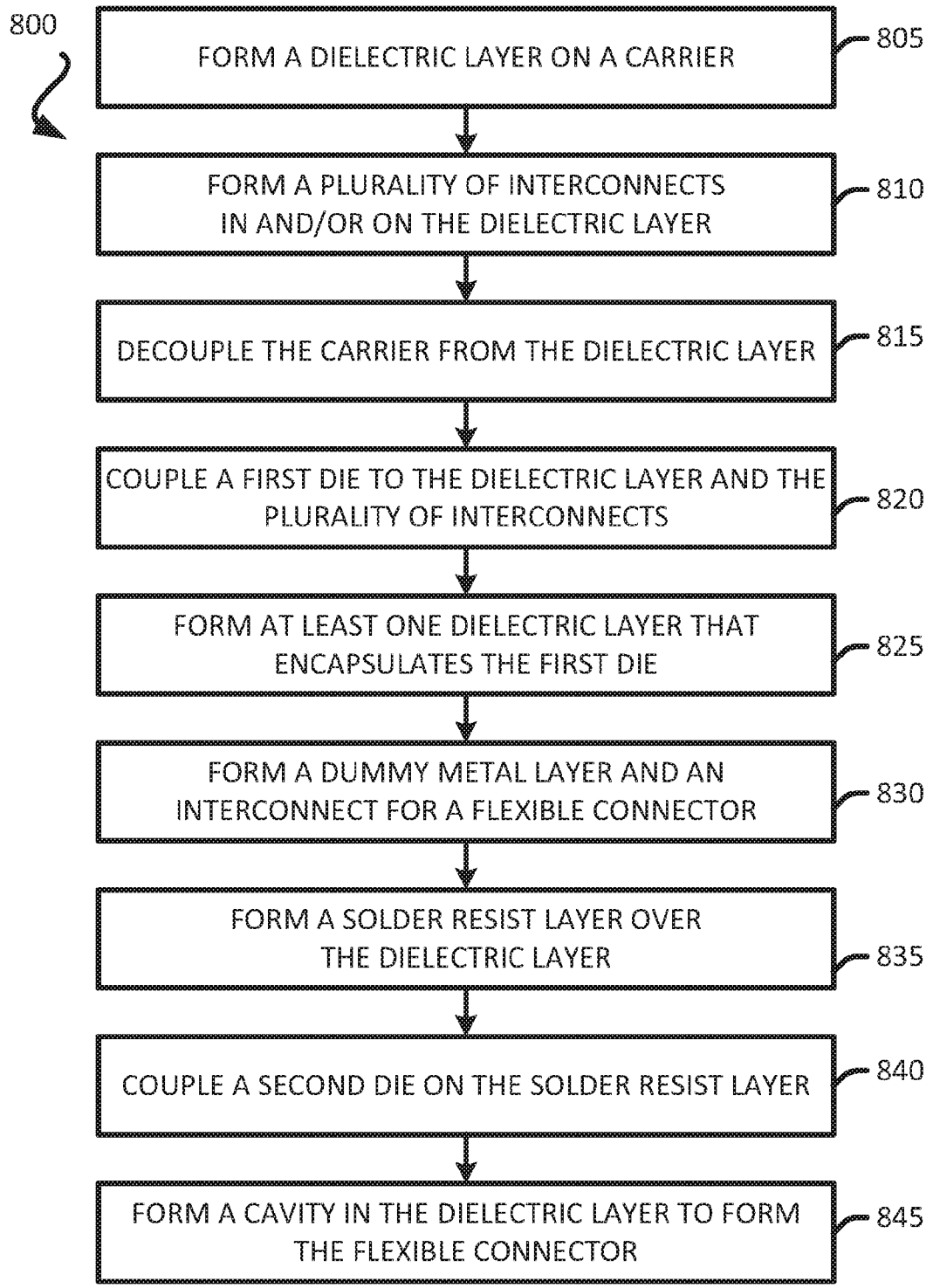
FIG. 8 illustrates a flow diagram of an exemplary method for fabricating a device that includes two packages coupled together through a flexible connector.

Exemplary Method for Fabricating an Integrated Device Comprising a Flexible Connector Between Packages In some implementations, providing/fabricating an integrated circuit (IC) device that includes an embedded flexible connector includes several processes. FIG. 8 illustrates an exemplary flow diagram of a method 800 for providing/fabricating integrated circuit (IC) device that includes an embedded flexible connector. In some implementations, the method of FIG. 8 may be used to fabricate the integrated circuit (IC) device that includes an embedded flexible connector of FIGS. 2-6 and/or other integrated circuit (IC) devices described in the present disclosure. FIG. 8 will be described in the context of fabricating the integrated circuit (IC) device of FIG. 2.

It should be noted that the flow diagram of FIG. 8 may combine one or more processes in order to simplify and/or clarify the method for providing an integrated circuit (IC) device. In some implementations, the order of the processes may be changed or modified.

The method forms (at 805) a dielectric layer (e.g., dielectric layer 260) on a carrier (e.g., carrier 700). The carrier may be an adhesive layer. The dielectric layer may include a polyimide (PI) layer.

The method form (at 810) a plurality of interconnects in and/or the dielectric layer. The plurality of interconnects may be the plurality of interconnects 703 and 705. In some implementations, the plurality of interconnects may be formed using a lithography process that includes forming a seed layer, a lamination process, an exposure process, a developing process, a plating process, a strip process and an etching process (e.g., seed etching process).

The method decouples (at 815) the carrier (e.g., 700) from the dielectric layer (e.g., 260) and the plurality of interconnects (e.g., 703). In some implementations, decoupling the carrier includes detaching and/or removing the carrier.

The method couples (at 820) a first die (e.g., 222) to the plurality of interconnects (e.g., 703). In some implementations, solder interconnects may be used to couple the first die to the plurality of interconnects.

The method forms (at 825) at least one dielectric layer (e.g., first dielectric layer 220) that at least partially encapsulates the first die (e.g., first die 222). The dielectric layer may include a polyimide (PI) layer.

The method forms (at 830) a dummy metal layer (e.g., dummy metal layer 269) that is configured to operate as a back stop to prevent a laser from further drilling in the dielectric layer. The dummy metal layer may be formed in a flexible connector.

In some implementations, forming the dummy metal layer may further includes forming a plurality of interconnects in the dielectric layer, such as forming the interconnect 265. In some implementations, the plurality of interconnects may be formed using a lithography process that includes forming a seed layer, a lamination process, an exposure process, a developing process, a plating process, a strip process and an etching process (e.g., seed etching process).

The method forms (at 835) a solder resist layer (e.g., solder resist layer 264) over the dielectric layer (e.g., third dielectric layer 262).

The method then couples (at 840) a second die (e.g., second die 224) to the solder resist layer (e.g., 264). In some implementations, solder interconnects may be used to couple the second die to the plurality of interconnects (e.g., 763). In some implementations, coupling one or more dies includes using surface mounting technology (SMT) process to mount the die.

The method forms (at 845) a cavity (e.g., cavity 209) in the dielectric layer (e.g., first dielectric layer 220) to form the flexible connector 206 that is configured to electrically, mechanically and structurally a first package (e.g., first package 202) to a second package (e.g., second package 204).

Exemplary Electronic Devices

Figure 9:
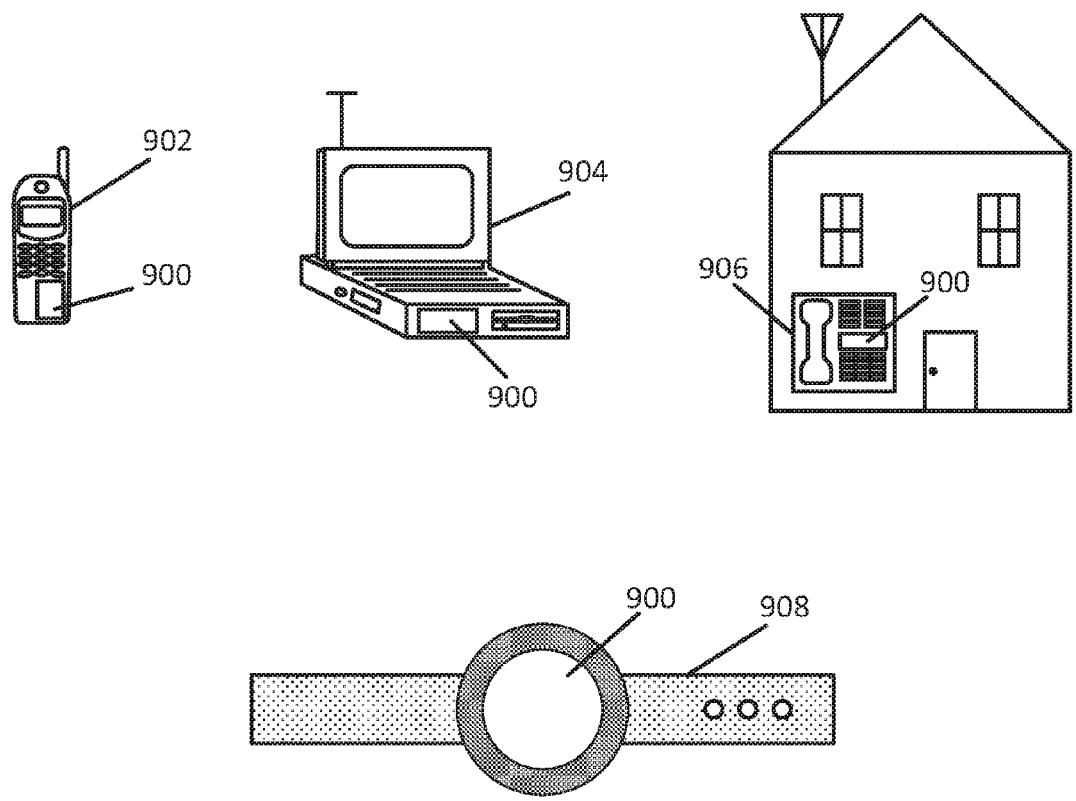
FIG. 9 illustrates various electronic devices that may include the various integrated devices, integrated device packages, semiconductor devices, dies, integrated circuits, and/or packages described herein.

FIG. 9 illustrates various electronic devices that may be integrated with any of the aforementioned integrated device, semiconductor device, integrated circuit, die, interposer, package or package-on-package (PoP). For example, a mobile phone device 902, a laptop computer device 904, a fixed location terminal device 906, a wearable device 908 may include an integrated device 900 as described herein. The integrated device 900 may be, for example, any of the integrated circuits, dies, integrated devices, integrated device packages, integrated circuit devices, device packages, integrated circuit (IC) packages, package-on-package devices described herein. The devices 902, 904, 906, 908 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7A-7F, 8, and/or 9 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7A-7F, 8, and/or 9 and its corresponding description in the present disclosure is not limited to dies and/or ICs. In some implementations, FIGS. 2, 3, 4, 5, 6, 7A-7F, 8, and/or 9 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. An integrated device comprising:
a first integrated circuit (IC) package comprising:
  a first die;
  a plurality of first interconnects; and
  a first dielectric layer encapsulating the first die;
a flexible connector coupled to the first integrated circuit (IC) package, wherein the flexible connector comprises:
  the first dielectric layer;
  a dummy metal layer; and
  an interconnect; and a second integrated circuit (IC) package coupled to the flexible connector, wherein the second integrated circuit (IC) package comprises:
the first dielectric layer; and
a plurality of second interconnects,
wherein the first integrated circuit (IC) package, the second integrated circuit (IC) package, and the flexible connector are coupled together through at least a portion of the first dielectric layer.

2. The integrated device of claim 1, wherein the portion of the first dielectric layer that is shared by the first integrated circuit (IC) package, the second integrated circuit (IC) package, and the flexible connector share a contiguous portion of the first dielectric layer.

3. The integrated device of claim 1, wherein the dummy metal layer is configured to not transmit an electrical signal.

4. The integrated device of claim 1, wherein the dummy metal layer is configured to stop a laser from penetrating into a portion of the first dielectric layer.

5. The integrated device of claim 1, wherein the second integrated circuit (IC) package comprises a second die located within the first dielectric layer.

6. The integrated device of claim 1, wherein the second integrated circuit (IC) package comprises a second die located over the first dielectric layer.

7. The integrated device of claim 1, wherein the first integrated circuit (IC) package comprises a second die located over the first dielectric layer.

8. The integrated device of claim 7, wherein the first die is a first die package and the second die is a second die package, and wherein the first integrated circuit (IC) package comprises a package on package (PoP) device.

9. The integrated device of claim 1, wherein the first dielectric layer comprises a polyimide (PI) layer.

10. The integrated device of claim 1, wherein the first dielectric layer comprises a plurality of dielectric layers.

11. The integrated device of claim 1, wherein the flexible connector is a package to package connector.

12. The integrated device of claim 1, wherein the flexible connector is configured to allow an electrical signal to traverse between the first integrated circuit (IC) package and the second integrated circuit (IC) package, while bypassing a printed circuit board (PCB).

13. The integrated device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

14. An apparatus comprising:
a first integrated circuit (IC) package comprising:
a first die;
a plurality of first interconnects; and
a first dielectric layer encapsulating the first die;
means for electrical connecting coupled to the first integrated circuit (IC) package, wherein the means for electrical connecting comprises:
the first dielectric layer;
a dummy metal layer; and
an interconnect; and
a second integrated circuit (IC) package coupled to the means for electrical connecting, wherein the second integrated circuit (IC) package comprises:
the first dielectric layer; and
a plurality of second interconnects,
wherein the first integrated circuit (IC) package, the second integrated circuit (IC) package, and the means for electrical connecting are coupled together through at least a portion of the first dielectric layer.

15. The apparatus of claim 14, wherein the portion of the first dielectric layer that is shared by the first integrated circuit (IC) package, the second integrated circuit (IC) package, and the means for electrical connecting share a contiguous portion of the first dielectric layer.

16. The apparatus of claim 14, wherein the dummy metal layer is configured to not transmit an electrical signal.

17. The apparatus of claim 14, wherein the dummy metal layer is configured to stop a laser from penetrating into a portion of the first dielectric layer.

18. The apparatus of claim 14, wherein the second integrated circuit (IC) package comprises a second die located within the first dielectric layer.

19. The apparatus of claim 14, wherein the second integrated circuit (IC) package comprises a second die located over the first dielectric layer.

20. The apparatus of claim 14, wherein the first integrated circuit (IC) package comprises a second die located over the first dielectric layer.

21. The apparatus of claim 14, wherein the first dielectric layer comprises a polyimide (PI) layer.

22. The apparatus of claim 14, wherein the means for electrical connecting is a package to package connector.

23. The apparatus of claim 14, wherein the means for electrical connecting is configured to allow an electrical signal to traverse between the first integrated circuit (IC) package and the second integrated circuit (IC) package, while bypassing a printed circuit board (PCB).

24. The apparatus of claim 14, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

25. A method for fabricating an integrated device, comprising:
providing a first integrated circuit (IC) package, wherein providing the first integrated circuit (IC) package comprises:
providing a first die;
forming a plurality of first interconnects; and
forming a first dielectric layer that encapsulates the first die;
forming a flexible connector such that the flexible connector is coupled to the first integrated circuit (IC) package, wherein forming the flexible connector comprises:
forming the first dielectric layer;
forming a dummy metal layer; and
forming an interconnect; and
providing a second integrated circuit (IC) package such that the second integrated circuit (IC) package is coupled to the flexible connector, wherein providing the second integrated circuit (IC) package comprises:
forming the first dielectric layer; and
forming a plurality of second interconnects,
wherein the first integrated circuit (IC) package, the second integrated circuit (IC) package, and the flexible connector are formed such that the first integrated circuit (IC) package, the second integrated circuit (IC) package, and the flexible connector are coupled together through at least a portion of the first dielectric layer.

26. The method of claim 25, wherein the portion of the first dielectric layer that is shared by the first integrated circuit (IC) package, the second integrated circuit (IC) package, and the flexible connector share a contiguous portion of the first dielectric layer.

27. The method of claim 25, wherein the dummy metal layer is configured to not transmit an electrical signal.

28. The method of claim 25, wherein the dummy metal layer is configured to stop a laser from penetrating into a portion of the first dielectric layer.

29. The method of claim 25, wherein forming the first dielectric layer comprises forming a polyimide (PI) layer.

30. The method of claim 25, wherein the flexible connector is configured to allow an electrical signal to traverse between the first integrated circuit (IC) package and the second integrated circuit (IC) package, while bypassing a printed circuit board (PCB).

* * * * *